US008748310B2

(12) United States Patent
Biro et al.

(10) Patent No.: US 8,748,310 B2
(45) Date of Patent: Jun. 10, 2014

(54) METHOD FOR PRODUCING A METAL CONTACT STRUCTURE OF A PHOTOVOLTAIC SOLAR CELL

(75) Inventors: Daniel Biro, Freiburg (DE); Benjamin Thaidigsmann, Freiburg (DE); Florian Clement, Freiburg (DE); Robert Woehl, Freiburg (DE); Edgar-Allan Wotke, Berlin (DE)

(73) Assignee: Fraunhofer-Gesellschaft zur Förderung der angewandten Forschung E.V., München (DE)

( * ) Notice: Subject to any disclaimer, the term of this patent is extended or adjusted under 35 U.S.C. 154(b) by 0 days.

(21) Appl. No.: 13/805,023

(22) PCT Filed: Jun. 16, 2011

(86) PCT No.: PCT/EP2011/002963
§ 371 (c)(1),
(2), (4) Date: Dec. 18, 2012

(87) PCT Pub. No.: WO2011/157420
PCT Pub. Date: Dec. 22, 2011

(65) Prior Publication Data
US 2013/0095604 A1   Apr. 18, 2013

(30) Foreign Application Priority Data

Jun. 18, 2010  (DE) .................. 10 2010 024 307
May 10, 2011  (DE) .................. 10 2011 101 083

(51) Int. Cl.
*H01L 21/44* (2006.01)

(52) U.S. Cl.
USPC ............... 438/661; 438/72; 438/98; 438/636; 438/660; 438/666; 257/E27.124; 257/E25.007; 427/74; 427/75

(58) Field of Classification Search
USPC .......... 427/74, 75; 438/72, 98, 636, 660–661, 438/666; 257/E27.124, E25.007
See application file for complete search history.

(56) References Cited

U.S. PATENT DOCUMENTS

| 4,703,553 A | 11/1987 | Mardesich |
| 2010/0098840 A1 | 4/2010 | Du et al. |

FOREIGN PATENT DOCUMENTS

| DE | 102009009840 A1 | 5/2010 |
| WO | 2009059302 A1 | 5/2009 |
| WO | 2010135535 A1 | 11/2010 |

OTHER PUBLICATIONS

Benick, J. et al., "High-Efficiency N-Type Silicon Solar Cells with Front Side Boron Emitter", 24th European PV Solar Energy Conference and Exhibition, Sep. 21-25, 2009, Hamburg, Germany.
(Continued)

*Primary Examiner* — Michelle Mandala
(74) *Attorney, Agent, or Firm* — Volpe and Koenig, P.C.

(57) ABSTRACT

A method for producing a metal contact structure of a photovoltaic solar cell, including: applying an electrically nonconductive insulating layer to a semiconductor substrate, applying a metal contact layer to the insulating layer, and generating a plurality of local electrically conductive connections between the semiconductor substrate and the contact layer right through the insulating layer. The metal contact layer is formed using two pastes containing metal particles: the first paste containing metal particles is applied to local regions, and the second paste containing metal particles is applied covering at least the regions covered with the first paste and partial regions located therebetween. By global heating the semiconductor substrate the first paste penetrates the insulating layer and forms an electrically conductive contact directly with the semiconductor substrate, whereas the second paste does not penetrate the insulating layer and is electrically conductively connected to the semiconductor substrate via the first paste.

17 Claims, 3 Drawing Sheets

(56) References Cited

OTHER PUBLICATIONS

Bultman, J.H., et al., "Fast and Easy Single Step Module Assembly for Back-Contacted C-SI Solar Cells with Conductive Adhesives".

Zhao, J., et al. "24% Efficient Perl Structure Silicon Solar Cells", 1990 IEEE, pp. 333-335.

Curtis, C.J., et al. "Spray and Inkjet Printing of Hybrid Nanoparticle-Metal-Organic Inks for Ag and Cu Metallizations", Mat. Res. Soc. Symp. Proc. vol. 606, 2001 Materials Research Society, pp. Y8 6.1-6.6.

METHOD FOR PRODUCING A METAL CONTACT STRUCTURE OF A PHOTOVOLTAIC SOLAR CELL

FIELD OF INVENTION

The invention relates to a method for producing a metallic contact structure of a photovoltaic solar cell.

BACKGROUND

A photovoltaic solar cell is formed of a planar semiconductor element in which, by means of incident electromagnetic radiation, generation of electron-hole pairs is obtained and charge carrier separation takes place at least one pn junction, such that an electrical potential difference arises between at least two electrical contacts of the solar cell and electrical power can be tapped off from the solar cell via an external electric circuit connected to said contacts.

In this case, the charge carriers are collected via metallic contact structures, such that, by making contact with said contact structures at one or more contact points, the charge carriers can be fed into the external electric circuit.

Competing requirements arise with regard to the design of the metallic contact structure: On the one hand, the average path length of a charge carrier in the semiconductor substrate to the closest contact point with a metallic contact structure is intended to be small so that ohmic losses on account of conduction resistances within the semiconductor are kept small. On the other hand, the contact area between metallic contact structure and semiconductor substrate is intended to be small since a high recombination rate is present at the contact area, compared with electrically passivated surfaces of the semiconductor substrate.

Particularly in the case of solar cells in which an emitter, and thus also the pn junction separating the charge carrier pairs generated, is formed at or in the region of the front side of the solar cell, said front side being designed for light incidence, electrical contact is made with the base typically by means of a metallic contact-making layer which is arranged on the rear side ad which is electrically conductively connected to the semiconductor substrate. In order to obtain high efficiencies, an efficient rear-side passivation, i.e. the obtaining of a low surface recombination rate for minority charge carriers, in particular in the region of the rear-side surface of the semiconductor substrate, and a formation of the electrical contact with a low contact resistance are essential in this case.

Thus, solar cell structures are known in which the rear side of the semiconductor substrate is covered substantially over the whole area with a passivation layer or insulating layer embodied as a silicon nitride layer, silicon dioxide layer or aluminum oxide layer or layer system, such that low surface recombination rates are obtained. It is only at point contacts that the passivation layer is opened in a linear fashion over a small area or in a point-like fashion and there is an electrically conductive connection to a metallic contact-making layer arranged on the passivation layer. In this case, the total area of the distributed contacts is significantly smaller than the area of the rear side of the solar cell. One such solar cell structure is, for example, the PERL structure (passivated emitter, rear locally defused) as described in J. Benick, B. Hoex, G. Dingemans, A. Richter, M. Hermle, and S. W. Glunz "High-efficiency n-type silicon solar cells with front side boron emitter," in Proceedings of the 24$^{th}$ European Photovoltaic Solar Energy Conference (Hamburg, Germany), 2009 and in Zhao et al., Proc. of the 21st IEEE PVSC, 333 (1990). This structure, which makes possible rear-side contact-making in order to achieve high efficiencies, requires additional photolithography steps during production, such that an industrial implementation of said solar cell structure is not practicable or is at least highly cost-intensive.

SUMMARY

The present invention is therefore based on the object of providing a method for producing a metallic contact structure of a photovoltaic solar cell which can be implemented industrially in a cost-effective manner and at the same time makes possible high efficiencies through the combination of regions passivated over a large area with local contact-making regions to form a metallic contact structure.

This object is achieved by a method according to the invention.

The method according to the invention for producing a metallic contact structure of a photovoltaic solar cell comprises the following method steps:

In a method step A, an electrically non-conductive insulating layer is applied to a surface of a semiconductor substrate, if appropriate to one or more intermediate layers covering said surface.

In a method step B, a metallic contact layer is applied to the insulating layer, if appropriate to one or more intermediate layers covering the insulating layer. Furthermore, one or more local electrically conductive connections between semiconductor substrate and contact layer are produced through the insulating layer and, if appropriate, further intermediate layers situated between contact layer and semiconductor substrate.

The result of method steps A and B is, therefore, that the surface of the semiconductor substrate, largely by means of the insulating layer, on the one hand is electrically insulated from the metallic contact layer and on the other hand is passivated with regard to the recombination activities and only at a plurality of local regions is there an electrically conductive connection between the semiconductor substrate and contact layer through the insulating layer.

What is essential is that in method step B the metallic contact layer is formed in a manner comprising the following method steps:

In a method step B1 a first paste containing metal particles is applied at a plurality of local regions. These are those local regions at which an electrically conductive connection to the semiconductor substrate is intended to be produced.

In a method step B2, a second paste containing metal particles is applied areally, in a manner at least partly covering at least the regions covered with the first paste and also the regions situated therebetween. The layer formed by means of the second paste thus covers at least the regions of the first paste which are applied in method step B1 and also at least partly the regions situated therebetween.

For interconnecting a solar cell with an external electric circuit or further solar cells in module interconnection, typically metallic contact structures of the solar cell are soldered to a metallic cell connector by means of a soldering method. On account of their composition, however, the metallic contact structures are typically not suitable or only suitable to a limited extent for a soldering connection, for which reason usually so-called "soldering pads", that is to say local metallic contact structures which, firstly, form an electrically conductive connection to the metallic contact making structure of the solar cell and, secondly, have good solderable properties, are additionally applied to the solar cell.

In one preferred embodiment of the method according to the invention, therefore, method step B additionally comprises a method step B3, wherein in method step B3 a third paste containing metal particles is applied on at least one local partial region, said third paste being designed in such a way that the third paste forms solderable metallic structures after the action of heat. In this way, a soldering pad is additionally formed in a cost effective procedure which can be implemented in particular in the inline method.

A method step B4 involves globally heating the semiconductor Substrate in a temperature step.

In this case, the first paste and second paste and also the temperature step or the temperature steps following method step B1 are designed in such a way that the first paste penetrates through the insulating layer and forms an electrically conductive contact directly with the semiconductor substrate, whereas the second paste does not penetrate through the insulating layer. Consequently, the metal layer that forms from the second paste is electrically conductively connected to the semiconductor substrate only indirectly via the first paste or the metal structures that form therefrom.

The method according to the invention thus makes it possible for the first time to obtain, in a simple manner which can be implemented industrially in a cost-effective way, an electrical contact-making, in particular of the rear side of a solar cell, which has regions passivated over a large area, on the one hand, and local contact-making regions, on the other hand. The use of two different pastes, only the first of which penetrates through the insulating layer in the temperature step or the temperatures step following paste application, makes it possible to obtain, by cost-effective methods, the abovementioned advantageous contact-making structure having a plurality of local contact-making regions and regions passivated over a large area on the surface of the semiconductor substrate.

In particular, for applying the pastes, it is possible to have recourse to methods which are known per se and already implemented industrially, such as, for example, screen printing or inkjet printing methods, which are already established for high throughput rates in the inline method and thus cost-effective production processes.

Various methods can be used for applying the pastes: screen printing, stencil printing, dispensing, inkjetting, laser transfer printing, pad printing, intaglio printing and other printing and deposition methods. Preferably, paste application is followed by a drying step in order to solidify the pastes.

Furthermore, for producing the metallic contact structure by means of the method according to the invention, it is possible to dispense entirely with cost-intensive photolithography. Only the first paste has to be applied in a targeted manner in the regions provided for the local contact-making. However, this is already possible nowadays without any problems for example using the already known methods mentioned above, in particular screen printing, stencil printing or inkjet printing methods or dispensing. The insulating layer and the second paste can be applied over a large area, and in particular over the whole area, and so here as well no masking steps whatsoever are necessary.

With the method according to the invention, therefore, the contact-making structure realized hitherto in cost-intensive complex processes, for producing high-efficiency solar cells, becomes implementable in a cost-effective industrial production method.

The global heating in method step B4 is preferably effected in a fast firing furnace as a firing step in which the wafers are conveyed through the hot region of the furnace in a continuous method. In this case, preferably temperatures of up to 1000° C. are attained, preferably maximum temperatures of less than 900° C. being used. The firing process will preferably be made very short, such that the wafers stay in the furnace only for a few minutes and are heated to the temperature only for a few seconds, as a result of which this process differs distinctly from pure drying processes.

Preferably, the second paste containing metal particles is applied areally between the regions covered with the first paste in such a way that the second paste connects the regions covered with the first paste, in such a way that after method step B4 there is an electrically conductive connection between the structures resulting from the first paste by means of the structure resulting from the second paste. In this case, preferably at least two adjacent structures resulting from the first paste are electrically conductively connected by the structure resulting from the second paste. With further preference, each structure resulting from the first paste is electrically conductively connected to at least one further structure resulting from the first paste by means of a structure resulting from the second paste.

Advantageously, the second paste containing metal particles is applied areally in such a way that at least 30%, preferably at least 50%, of the area of the intermediate regions, which intermediate regions are situated between the regions covered with the first paste, is covered by the second paste.

Preferably, in method step B2 the second paste is applied in such a way that it completely covers the regions covered with the first paste and also the regions situated therebetween. This ensures, in particular, a low electrical transverse conduction resistance. It likewise lies within the scope of the invention for the regions situated therebetween to be covered only partly, for example in a linear fashion, with the second paste. This ensures an electrically conductive connection by the second paste, or the metal structure arising therefrom, paste being saved on account of the partial coverage in comparison with the whole-area coverage of the regions situated therebetween. It likewise lies within the scope of the invention to use this contact-making structure for the formation of solar cells with which contact is made on the rear side, such as MWT, EWT or back junction solar cells.

Particularly advantageously, the third paste is actually arranged prior to the second paste on the substrate, such that the second paste can overlap the third paste in regions in order that a particularly good electrical and mechanical connection of these two pastes is formed in the subsequent firing step.

In one particularly simple embodiment, the third paste and the first paste are identical and are arranged in one step, for example by means of a screen printing process. The second paste is then arranged in such a way that the previously produced soldering pads are not covered or are only covered in regions and are thus accessible for subsequently making contact with the solar cell for example by means of soldering or adhesive bonding.

The third paste is preferably applied in such a way that the metallic structure resulting therefrom is electrically conductively connected to the metallic structure resulting from the second paste and/or the metallic structure resulting from the first paste.

Preferably, the third paste and also the temperature step or the temperature steps following method step B1 are designed in such a way that the third paste does not penetrate through the insulating layer. In this preferred embodiment of the method according to the invention, furthermore in method step B1 the first paste is applied to at least one first group and one second group of local regions, wherein in method step B2 the second paste is applied in a manner covering the regions of the first group which are covered with the first paste and also the regions situated therebetween, and in method step B3 the third paste is applied in a manner covering the regions of the second group which are covered with the first paste and also the regions situated therebetween.

In this advantageous embodiment, therefore, exclusively the first paste, or the metallic structures resulting therefrom, penetrates through the insulating layer. The metallic structure resulting from the third paste is, firstly, electrically conductively connected to the semiconductor substrate via the local regions of the second group that are covered with the first paste, and it is furthermore electrically conductively connected to the second paste or the metallic structure resulting therefrom.

In an alternative advantageous embodiment, the third paste is designed in such a way that it penetrates through the insulating layer in the temperature step or the temperature steps following method step B1. In this embodiment, therefore, an electrical contact between the metallic contact structure resulting from the third paste and the semiconductor substrate is effected directly, wherein, in this embodiment, too, the metal structure resulting from the third paste is electrically conductively connected to the metal structure resulting from the second paste. In particular it is advantageous in this case that the first and third pastes are identical and are applied to the semiconductor substrate preferably simultaneously, preferably in a common process step.

Preferably, the second and third pastes are applied in a manner electrically conductively connected to one another. In this case, it lies within the scope of the invention to apply the second and third pastes such that they do not overlap, but directly adjoin one another. This affords the advantage that, firstly, defined regions are formed with regard to the soldering pads on the contact-making side of the solar cell in the case of small height differences and, secondly, an electrically conductive connection between second paste and third paste or the metal structures resulting therefrom, said connection exhibiting low ohmic conduction losses, is ensured by the pastes adjoining one another.

In order to ensure a secure electrically conductive connection between first paste and third paste or the structures resulting therefrom, it is advantageous to apply to the second and third pastes in an overlapping fashion, preferably in such a way that the third paste overlaps the second paste. Preferably, the pastes are applied in an overlapping fashion such that they overlap by a length in the range of between 0.1 mm and 2 mm.

In a further preferred embodiment of the method according to the invention, the third paste is applied to the second paste. As a result, although this gives rise to height differences on the contact-making side, in return the accuracy of the printing methods can be provided with a higher tolerance, since the regions printed with second and third pastes no longer adjoin one another.

In a further advantageous embodiment, the second paste is designed in such a way that it does not penetrate through the insulating layer, and that, after the action of heat or as a result of a further after treatment, said second paste forms a metallic structure that is solderable or electrically interconnectable in some other way, or such a structure is formed on said second paste. The separate production of soldering pads is thereby obviated. In this preferred embodiment, therefore, the entire second paste applied areally, or the metal structure resulting therefrom, is suitable for a solderable connection or an alternative interconnection technology. In particular, the second paste, or the metal structure resulting therefrom, is suitable for electrical contact-making by means of conductive adhesives, as described in "Fast and easy single step module assembly for back-contacted C—Si solar cells with conductive adhesives", 2003, Bultman, Osaka.

The pastes containing metal particles known to the person skilled in the art from previously known screen printing or inkjet printing methods or other methods for producing metallic contact structures can be used for implementing the method according to the invention. In particular, the person skilled in the art knows, for a predefined insulating layer in predefined temperature steps, which pastes achieve penetration through the insulation layer and which do not.

The insulating layer is preferably embodied as a dielectric layer, in particular preferably as a silicon nitride layer, silicon oxide layer, aluminum oxide layer, silicon carbide layer, titanium dioxide layer, or as a layer containing mixtures of the materials mentioned. The embodiment of the insulating layer as a layer system composed of a plurality of layers likewise lies within the scope of the invention. Advantageously, the insulating layer or the layer system used as an insulating layer has a thickness in the range of between 5 nm and 500 nm, in particular between 20 nm and 250 nm, with further preference between 50 nm and 250 nm. In particular, a layer system composed of a layer of aluminum oxide and a layer of silicon nitride preferably having a total thickness of 100 nm or a layer system composed of a layer of silicon oxide and a layer of silicon nitride, preferably having a total thickness of 200 nm, has proved to be advantageous in experiments conducted by the applicant, in particular with regard to the insulation effect.

Preferably, the first and second pastes have the following specification: the first paste preferably contains substances that penetrate through the insulating layer in a high-temperature step. In particular, the first paste preferably contains glass frit, preferably up to 10% lead and/or bismuth-boron glass, or pure lead and/or bismuth oxides. In a further preferred embodiment, the first paste contains one or more oxides, preferably from the group: $GeO_2$, $P_2O_5$, $Na_2O$, $K_2O$, CaO, $Al_2O_3$, MgO, $TiO_2$, ZnO and $B_2O_3$.

In order to support the formation of a better local back surface field, the use of a first paste enriched with phosphorus or other elements corresponding to the base doping type is advantageous. If the base doping is a p-type doping, the first paste contains corresponding dopants that allow a p-type doping. In particular, aluminum, boron and/or gallium can be contained.

The second paste preferably contains abovementioned substances which do not attack the passivation or only attack it in small amounts (preferably less than 2%). In particular, the second paste preferably contains no glass frit, or only glass frit with a proportion of less than 1%. In particular, an aluminum paste or a copper paste is preferably used as second paste. The aluminum paste is distinguished by a large proportion of aluminum-containing metal particles (preferably greater than 50%).

The third paste preferably has the following specifications:

Preferably, the third paste has a silver proportion of at least 70%, in order to ensure a good solderability. The use of a third paste enriched with other solderable metals is likewise within the scope of the invention, preferably tin, gold, copper, iron or nickel or combinations thereof. The total proportion of the solderable metals in the third paste is preferably at least 70%.

It is advantageous to use a third paste which additionally comprises additives as mentioned with regard to the first paste, if the intention is for the third paste to penetrate through the insulating layer. In particular, in this case it is advantageous to use a third paste which additionally comprises additives for local high doping which correspond to the base doping type, preferably phosphorus or other elements in the case of an n-type doping and preferably aluminum or boron or other elements in the case of a p-type base doping.

In a further preferred embodiment, after method step B1 and before method step B2 the first paste is dried. The drying process preferably comprises the following method steps: heating to a temperature at which the paste carrier materials used evaporate at least partly, preferably completely. Heating to a temperature in the temperature range of between 150° C. and 300° C. is preferably effected in the drying process.

The separate drying of the first paste prior to applying the second paste has the advantage that the first paste is dry and thus maintains its form when the second paste is applied. Moreover, no intermixing of the paste constituents takes place, which prevents the through-firing effect from being weakened.

In a further preferred embodiment of the method according to the invention, no high-temperature step i.e. in particular no heating to more than 500° C., takes place between method step B1 and method step B2.

In particular, it is advantageous to treat the first and second pastes and particularly preferably also the third paste in a common temperature step, such that all applied pastes are converted into metallic contact structures in the common temperature step in method step B4. Particularly simple and cost effective processing is made possible as a result.

Preferably, at least one of the pastes, preferably the paste which penetrates through the insulation layer, is enriched with silicon or a silicon compound, preferably with silicon. It lies within the scope of the invention for the enrichment to consist in a concentration of between 0.1% and 12%, in particular in a concentration of between 4% and 8%. However, the enrichment preferably consists in a concentration of between 0.1% and 99%, with further preference in a concentration of between 8% and 80%, particularly preferably in a concentration of 12% to 60%.

The enrichment with silicon or a silicon compound has the advantage that the alloying process between the metal contained in the paste and the silicon semiconductor substrate, which process is crucial for the electrical conductivity, inter alia, proceeds with significantly less damage and the recombination near the contact point is thus reduced.

It likewise lies within the scope of the invention to admix aluminum-silicon alloys with the paste. In this case, it is advantageous to use a paste having a concentration of aluminum-silicon alloy of at least 1%, preferably at least 10%, with further preference at least 25%. In this case, it is particularly advantageous for the paste to have a silicon proportion in the range of 5% to 90%, preferably in the range of 12% to 80%. In particular, it is advantageous to use a eutectic mixture having a proportion of approximately 12% silicon.

An admixture of aluminum-silicon alloys has the advantage that the melting point of the paste decreases and the alloying process proceeds more homogenously.

In a further preferred embodiment, the second paste and/or the third paste contain(s) silver, preferably in a concentration of at least 70%, particularly in the range of 80% to 100%. This ensures a solderability of the metal structure produced of the second paste and/or the third paste.

In a further preferred embodiment, the first paste and/or the third paste contain(s) a dopant of the base doping type of the solar cell to be produced. This results in a local high doping in the regions in which the first paste or the metal structure resulting therefrom is directly in electrical contact with the semiconductor structure. As a result of such a local high doping on account of the dopant of the first paste, firstly the contact resistance and secondly the recombination rate are in each reduced at the contact area metal/semiconductor surface and a further increase in the efficiency of the solar cell is thus obtained.

It is furthermore advantageous to use an aluminum-containing paste as first paste, preferably having an aluminum content of 70% to 100%. As a result, a rear-side p+-type emitter can be formed on a semiconductor substrate having an n-type doping during the high-temperature step. On p-type semiconductors, it is possible to produce a local high doping and thus a p+-type back surface field that reduces the recombination rate.

In a further preferred embodiment, an Al paste enriched with silicon can be used as first paste for cell concepts in which a p-type emitter is at least partly required on the rear side. Said emitter arises during the high-temperature process at the locations of the rear side which are covered with the aluminum-containing paste. In this case, the Al paste can be applied either over the whole area or in a structured fashion.

In one preferred embodiment, therefore, at least the first paste and/or the third paste contain(s) a dopant of the emitter doping type, i.e. having a doping type opposite to the base doping type of the solar cell to be produced. As a result, a local emitter is formed on the rear side.

Preferably, method step B4 involves a global heating of the semiconductor structure to at least 700° C. for a time duration of at least 5 s. Preferably, a temperature maximum of at least 730° C. is achieved during the aforementioned time duration.

A particularly cost-effective industrially implementable configuration of the method according to the invention results from the fact that at least one of the pastes, preferably all of the pastes, is/are applied by means of inkjet printing methods or aerosol printing methods. The application of pastes containing metal particles by means of inkjet printing methods is known per se and described for example in "Spray and inkjet printing of hybrid nanoparticle-metal-organic inks for Ag and Cu metallizations", Curtis, 2002, Mat. Res. Soc. Symp. Proc.

The method according to the invention is preferably used for producing a solar cell which is essentially formed by a silicon semiconductor substrate. In particular, the method according to the invention is advantageous for forming the contact structure on the rear side of the solar cell, opposite the light incidence side.

In the case where the base doping and the doping achieved by the first paste have the same doping type (for example p-type), it is advantageous if the proportion of coverage of the solar cell side by the first paste, or the structure emerging therefrom, is less than 50%, particularly advantageously less than 12%, and preferably less than 7%. It is likewise advantageous in this case if at least one dimension of partial regions of first contact structures is less than 500 μm, preferably less than 200 μm, furthermore less than 100 μm, in particular less than 50 μm. These partial regions are preferably embodied in a punctiform or linear fashion, wherein at least one dimension of the structures is preferably less than 500 μm, preferably less than 200 μm, furthermore less than 100 μm, in particular less than 50 μm. Preferably, the first paste is applied in such a way that punctiform, linear and/or comb-like contact-making areas known per se are formed between metallization and semiconductor.

If the base doping is opposite to the doping which can be achieved by the first paste, a coverage of greater than 7%, preferably greater than 12%, and in particular greater than 50%, of the solar cell side by the first paste, or the structure emerging therefrom, is advantageous. It is likewise advantageous in this case if at least one dimension of partial regions of first contact structures is greater than 50 μm, preferably greater than 100 μm, furthermore greater than 200 μm, in particular greater than 500 μm. These partial regions are preferably formed in a punctiform or linear fashion, wherein at least one dimension of the structures is greater than 50 μm, preferably greater than 100 μm, furthermore greater than 200 μm, in particular greater than 500 μm.

The semiconductor substrate used is preferably a silicon wafer, in particular having a base doping corresponding to base resistances in the range of 0.1 ohm cm to 10 ohm cm, preferably in the range of 1 ohm cm to 5 ohm cm. Furthermore, the use of semiconductor substrates having a thickness of less than 250 μm, preferably less than 170 μm, preferably less than 100 μm, is advantageous.

BRIEF DESCRIPTION OF THE DRAWINGS

Further preferred embodiments and advantageous features are explained below with reference to the figures and the description of the figures, in which.

DETAILED DESCRIPTION OF THE PREFERRED EMBODIMENTS

Figure 1:
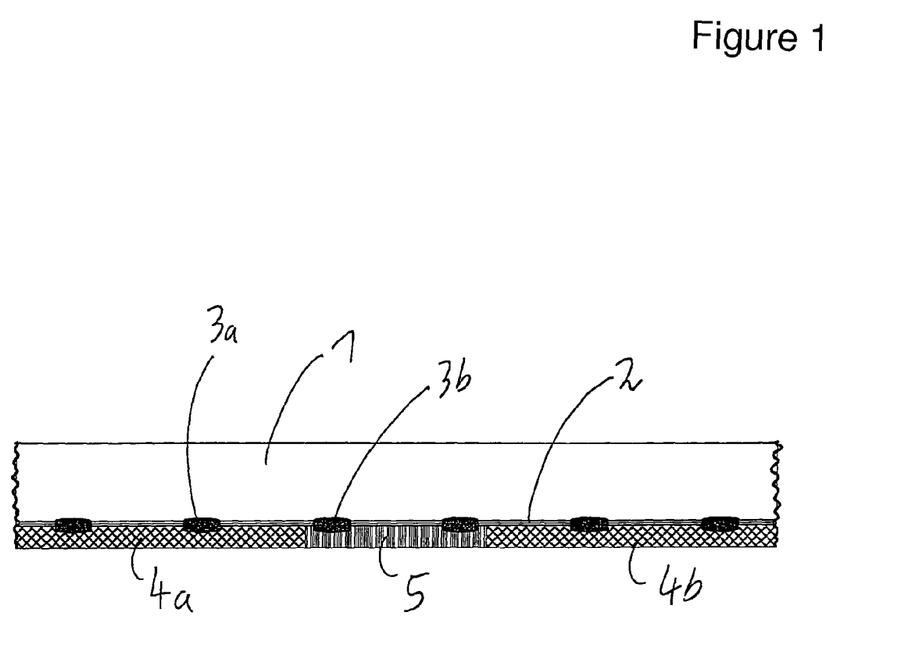
FIG. 1 shows a partial section from a solar cell whose rear-side metallic contact structure was produced by means of a first exemplary embodiment of the method according to the invention and has soldering pads which do not penetrate through the insulating layer.
Figure 2:
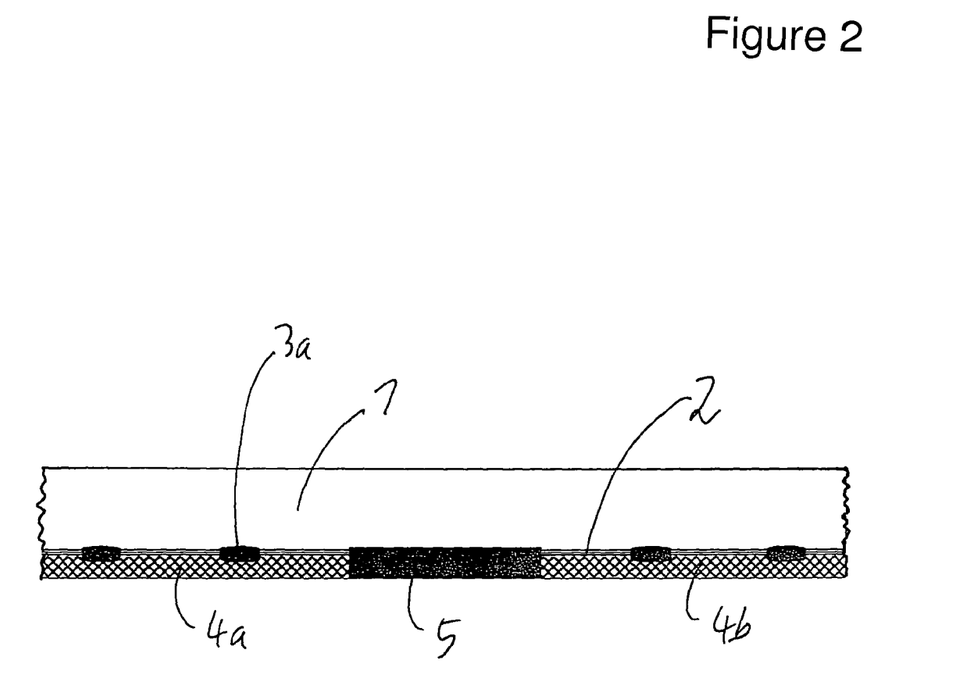
FIG. 2 shows a partial section from a solar cell whose rear-side metallic contact structure was produced by means of a second exemplary embodiment of the method according to the invention, in which the soldering pad penetrates through the insulating layer.
Figure 3:
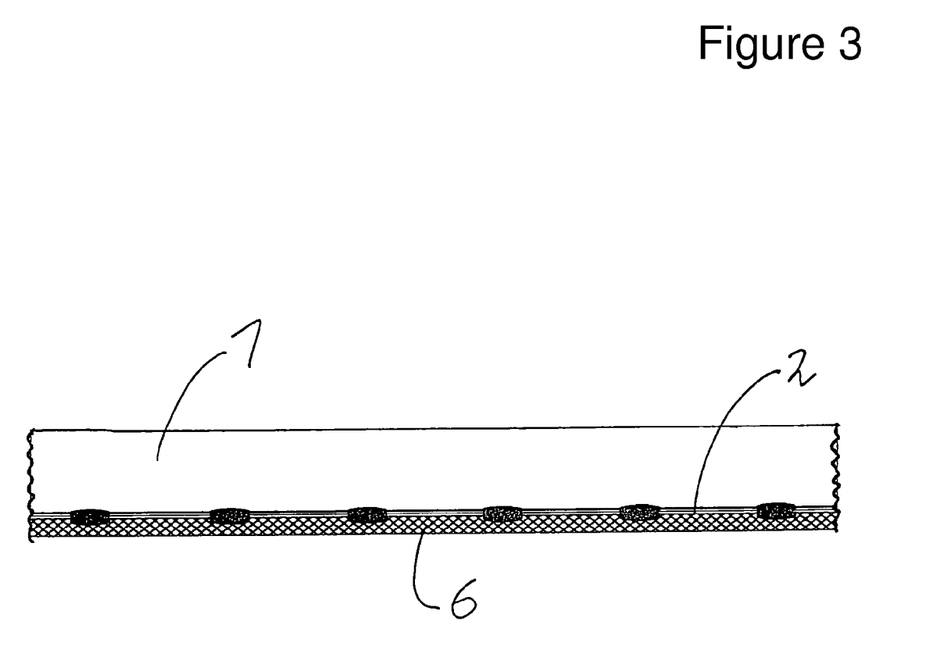
FIG. 3 shows a partial section from a solar cell in which the rear-side metallic contact structure was formed by means of a third exemplary embodiment of the method according to the invention, in which the entire metal layer produced areally on the rear side is formed as a soldering pad.

FIGS. 1 to 3 in each case illustrate a partial section from a solar cell produced from a semiconductor substrate 1 embodied as a silicon wafer. The solar cell continues toward the right and left. In particular, the solar cell has a multiplicity of local electrical contact-making regions, only some regions being illustrated for the sake of better clarity in FIGS. 1 to 3. Furthermore, the structures and dopings at the front side of the solar cell illustrated have not been illustrated; customary solar cell structures, in particular customary arrangements of emitter and metallic emitter contact structures making contact with the emitter and also passivation layers and antireflection layers and textures optimizing light incidence are conceivable here in FIGS. 1 to 3.

Identical reference signs designate identical elements in FIGS. 1 to 3.

The semiconductor substrate 1 is a p-doped silicon wafer having a base doping of approximately 2.7 ohm cm.

The metallic contact structure illustrated in FIG. 1 was produced by means of a first exemplary embodiment of the method according to the invention, comprising the following method steps:

In a method step A, a silicon dioxide layer 2 having a thickness of 250 nm was applied and etched back to a thickness of 100 nm in further process steps. The following parameters were used for the oxidation: thermal oxidation at 900° C. for 150 min in a water vapor atmosphere (partial pressure approximately 90-100%).

Afterward, in a method step B1, a multiplicity of local regions of a first paste containing metal particles were applied, two regions 3a and 3b being identified by way of example in FIG. 1.

In this case, the local region 3a belongs to a first group of local regions and the local region 3b belongs to a second group of local regions. The first paste was applied to the insulating layer at the local regions 3a, 3b. Afterward, in a method step B2, a second paste was applied in the regions 4a and 4b, in such a way that the second paste covers the first group the regions of the first group which are covered with the first paste 3a, and also the regions situated therebetween.

Furthermore, in a method step B3, a third paste containing metal particles was applied in a region 5, such that second paste and third paste adjoin one another and have an electrical connection. The pastes can also overlap for a better electrical and mechanical connection.

In a common temperature step in a method step B4, global heating was effected in one temperature step. The temperature step was performed in a continuous furnace with the following parameters: heating within 10s to 500° C., maintaining this temperature for 10s. Further heating to 800° C. within 5 s, cooling to room temperature within 15-25 s.

In this temperature step, firstly metallic structures were formed from first, second and third pastes, wherein only the first paste is designed to penetrate through the insulating layer 2. This was achieved by virtue of the fact that the first paste contains lead glass frit in a concentration of between 1% and 5%, whereas the second and third pastes contain no glass frit. It is likewise possible to use a second and third paste which contain an inadequate concentration or unsuitable type of glass frit for penetrating through said layer.

As a result, after carrying out method step B4, as illustrated in FIG. 1, there is therefore a direct electrically conductive connection between first paste, or the metallic structure resulting therefrom, in the local regions 3a, 3b, whereas second and third pastes, or the metallic structures resulting therefrom, are electrically conductively connected to the semiconductor substrate only indirectly via the first paste or the metal structure resulting therefrom. In this exemplary embodiment, therefore, local structures of the first paste were also arranged below the regions in which the third paste is arranged.

The third paste has a silver proportion of approximately 90%, such that a good solderability is provided and the third paste or the metallic structure resulting therefrom thus functions as a soldering pad.

In a second exemplary embodiment of the method according to the invention, the third paste is designed in such a way that it likewise penetrates through the insulating layer 2 in the temperature step carried out in method step B4. Therefore, in this exemplary embodiment, it is not necessary for local regions in the region 5 in which the third paste is applied to be printed with the first paste. The remaining method steps are identical to the method steps described for FIG. 1.

As illustrated in FIG. 2, therefore, this exemplary embodiment has the result that the soldering pad formed by means of the third paste in the region 5 is directly electrically conductively connected to the semiconductor substrate 1 over the whole area, whereas the second paste or the metal structure resulting therefrom is electrically conductively connected to the semiconductor substrate only indirectly via the first paste or the metal structure resulting therefrom.

In this exemplary embodiment, therefore, some regions in which the first paste has to be printed are omitted in comparison with the exemplary embodiment in accordance with FIG. 1, thus resulting in a saving of paste and a better electrical contact between soldering pad and semiconductor substrate.

In contrast to the first exemplary embodiment, the third paste has the following parameters: it contains glass frit (bismuth/lead glass frit) in order to enable through-firing of the insulation layer. Furthermore, the third paste contains dopant of the base doping type in order to achieve a better contact and a lower recombination rate.

In a third exemplary embodiment of the method according to the invention, only a first and a second paste are used. In this case, the second paste is applied, over the whole area, to the insulating layer or the previously applied first paste. The process parameters correspond to those described in the first exemplary embodiment.

The result is illustrated in FIG. 3: the second paste 6, or the metallic structure resulting therefrom, covers the whole area of the rear side of the solar cell to be produced, wherein there is an electrically conductive contact with the semiconductor substrate 1 only in the local regions in which the first paste was printed.

In this exemplary embodiment, therefore, only two pastes have to be printed, with the result that a further simplification of the production process is obtained.

For a good solderability, the second paste in this case has a silver proportion of 90%.

All of the abovementioned percentages with regard to the constituents of the pastes relate to percent by mass.

The invention claimed is:

1. A method for processing a metallic contact structure of a photovoltaic solar cell, comprising the following method steps:
   A applying an electrically non-conductive insulating layer to at least one of a surface of a semiconductor substrate, or one or more intermediate layers covering said surface,
   B applying a metallic contact layer to at least one of the insulating layer or one or more intermediate layers covering the insulating layer, and producing one or more local electrically conductive connections between semiconductor substrate and contact layer through the insulating layer, wherein in method step B the metallic contact layer is formed in a manner comprising the following method steps:
      B1 a first paste containing metal particles is applied at a plurality of local regions,
      B2 a second paste containing metal particles is applied areally, in a manner at least partly covering at least the local regions covered with the first paste and also regions situated therebetween,
      B3 a third paste containing metal particles is applied on at least one local partial region, and
      B4 globally heating the semiconductor substrate and at least the first and second pastes in a temperature step,
   wherein the first paste and the second paste and also the temperature step or further temperature steps following method step B1 are designed such that the first paste penetrates through the insulating layer and forms an electrically conductive contact directly with the semiconductor substrate, whereas the second paste does not penetrate through the insulating layer and is electrically conductively connected to the semiconductor substrate only indirectly via the first paste, and the third paste forming a solderable metallic structure after the action of heat.

2. The method as claimed in claim 1, wherein the third paste and also the temperature step or the further temperature steps following method step B1 are designed such that the third paste does not penetrate through the insulating layer, and
   in method step B1 the first paste is applied to at least one first group and one second group of local regions, in method step B2 the second paste is applied in a manner covering the regions of the first group of the local regions which are covered with the first paste and also the regions situated therebetween, and in method step B3 third paste is applied in a manner covering the regions of the second group which are covered with the first paste and also the regions situated therebetween.

3. The method as claimed in claim 1, wherein the third paste and also the temperature step or the further temperature steps following method step B1 are designed such that the third paste penetrates through the insulating layer in the temperature step or the further temperature steps following method step B1.

4. The method as claimed in claim 1, wherein the first paste and the third paste are applied in an overlapping fashion.

5. The method as claimed in claim 1, wherein first and third pastes are identical and are applied in a common method step.

6. The method as claimed in claim 1, wherein the third paste is applied to the second paste.

7. The method as claimed in claim 1, wherein the first paste contains one or more substances which penetrate through the insulating layer, and the second paste contains no substances which penetrate through the insulating layer.

8. The method as claimed in claim 1, wherein the insulating layer is embodied as a dielectric layer.

9. The method as claimed in claim 1, wherein after method step B1 and before method step B2 the first paste is dried.

10. The method as claimed in claim 1, wherein no high-temperature step takes place between method step B1 and method step B2.

11. The method as claimed in claim 1, wherein at least one of the pastes is enriched with silicon.

12. The method as claimed in claim 1, wherein at least one of the second paste or the third paste contain(s) silver.

13. The method as claimed in claim 1, wherein at least one of the first paste or third paste contain a dopant.

14. The method as claimed in claim 1, wherein method step B4 involves heating to at least 750° C. for a time duration of at least 3 s.

15. The method as claimed in claim 1, wherein at least one of the pastes is applied by one of the following methods: screen printing method, stencil printing method, laser transfer printing method, inkjet printing method or dispensing.

16. The method as claimed in claim 1, wherein the first paste comprises a dopant of the base doping type, and the first paste is applied in such a way that a proportion of coverage of the solar cell side by the first paste, or the structure emerging therefrom, is less than 50%.

17. The method as claimed in claim 1, wherein the first paste comprises a dopant of an emitter doping type, and the first paste is applied in such a way that a proportion of coverage of the solar cell side by the first paste, or the structure emerging therefrom, is greater than 7%.

* * * * *